United States Patent [19]

Chang

[11] Patent Number: 4,958,321
[45] Date of Patent: Sep. 18, 1990

[54] ONE TRANSISTOR FLASH EPROM CELL

[75] Inventor: Chi Chang, Redwood City, Calif.

[73] Assignee: Advanced Micro Devices, Inc., Sunnyvale, Calif.

[21] Appl. No.: 247,887

[22] Filed: Sep. 22, 1988

[51] Int. Cl.$^5$ .............................................. G11C 11/40
[52] U.S. Cl. .................................... 365/185; 365/218
[58] Field of Search .................. 365/182, 185; 357/23, 357/24, 41, 49, 54

[56] References Cited

U.S. PATENT DOCUMENTS

| 4,409,723 | 10/1983 | Harari | 357/23.5 |
|---|---|---|---|
| 4,698,787 | 10/1987 | Mukherjee et al. | 365/185 |
| 4,811,078 | 3/1989 | Tigelaar et al. | 357/54 |

OTHER PUBLICATIONS

"A 128K Flash EEPROM Using Double-Polysilicon Technology", Samachisa et al., IEEE Journal of Solid State Circuits, vol. SC-22, No. 5, 10/87.
"Corner-Field Induced Drain Leakage in Thin Oxide MOSFETS", Chang et al., Advanced Micro Devices, IEEE IEDM 87, p. 714.
"Flash-Erase EEPROM Cell with Asymmetric Source and Drain Structure", H. Kume et al., Central Research Laboratory, Hitachi, Ltd., IEEE IEDM 87, p. 560.
"An In System Reprogrammable 256K CMOS Flash Memory", Virgil Niles, Kynett et al., Intel Corp. 1988, IEEE Int'l Solid State Conference.
"A High Density CMOS 1-T Electrically Erasable Non-Volatile (Flash) Memory Technology", S. Tam et al., Intel Corp.
"Reliability Performance of ETOX Based Flash Memories", Verma et al., Intel Corp. 1988, IEEE/IRPS.
"A Single Transistor EEPROM Cell and its Implementation in a 512K CMOS EEPROM", Mukherjee et al., IEEE IDFM 85, p. 616.

Primary Examiner—Terrell W. Fears
Attorney, Agent, or Firm—Fliesler, Dubb, Meyer & Lovejoy

[57] ABSTRACT

An electrically programmable floating gate transistor useful as a one transistor flash EPROM cell includes a multi-thickness dielectric provided on a substrate. The multi-thickness dielectric limits tunnelling from a floating gate provided on the multi-thickness dielectric to a drain during programming and allowing tunnelling from the floating gate to the source during erasing. The floating gate has a low doping concentration, less than $5 \times 10^{18}$ cm$^{-3}$, and a thickness of less than 1000 Å to provide a self-limiting erase characteristic.

27 Claims, 5 Drawing Sheets

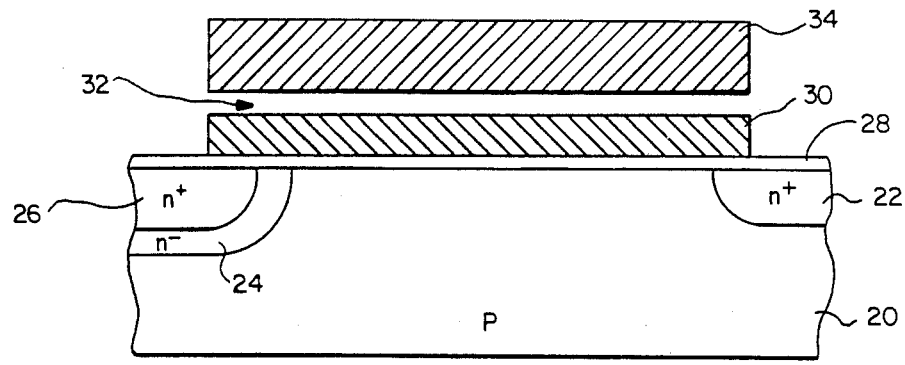
FIG.—1 (PRIOR ART)
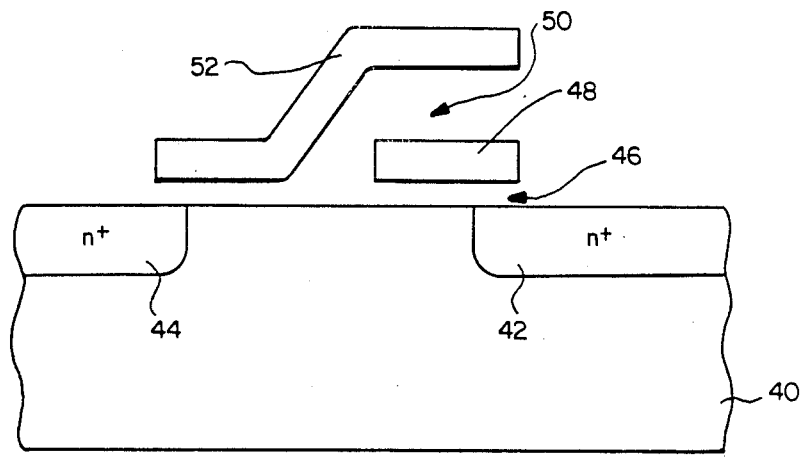
FIG.—2 (PRIOR ART)

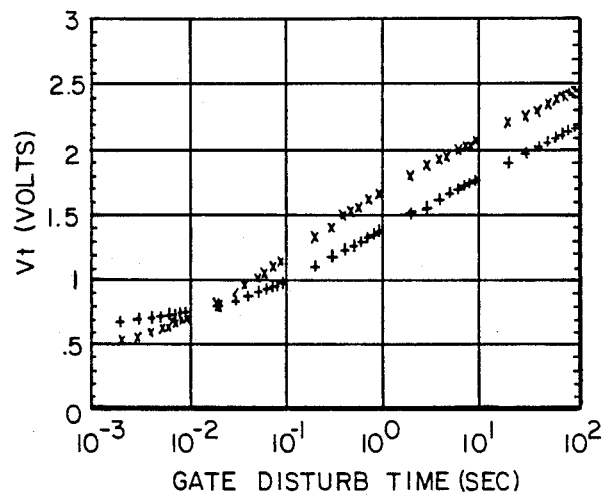
FIG.—9A
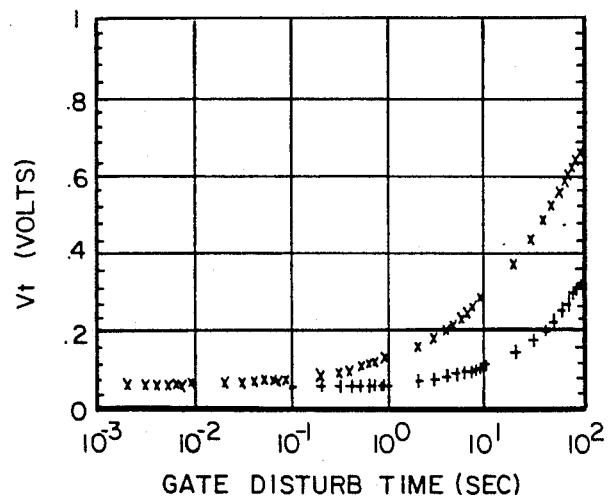
FIG.—9B

ONE TRANSISTOR FLASH EPROM CELL

Background of the Invention

1. Field of the Invention

The present invention relates to one transistor flash EPROM memory cells.

2. Description of the Related Art

Flash EPROMs are a type of non-volatile memory which provides electrical erasing and a small cell size. The small cell size relates to the fact that each cell includes a single transistor. The term "flash" refers to the ability to rapidly erase the memory with electrical pulses. The erase operation erases an entire memory array, or at least large portion of the array -- single bits and/or bytes are not individually erasable.

The flash EPROM cell includes a floating gate transistor which is programmed from the drain side by injecting hot electrons to the floating gate. Erasing can be accomplished from either the source or the drain side, with Fowler-Nordheim tunneling being the erase mechanism.

Conventional flash EPROM cell structures are shown in FIGS. 1 and 2. Conventional flash EPROMS, including those shown in FIGS. 1 and 2, and the characteristics of same, are described in the following publications: (1) "A 128K Flash EPROM Using Double-Polysilicon Technology," Samachisa et al., IEEE Journal of SolidState Circuits, Vol. SC-22, No. 5, October 1987; (2) "Corner-field Induced Drain Leakage In Thin Oxide Mosfets," Chi Chang and Jih Lien, Advanced Micro Devices, IEEE, IEDM 87, p. 714; (3) "A Flash-Erase EEPROM Cell With An Asymmetric Source and Drain Structure," H. Kume et al., Central Research Laboratory, Hitachi Ltd., IEEE, IEDM 87, p. 560; (4) "An In-System Reprogrammable 256K CMOS Flash Memory," Virgil Niles Kynett et al., Intel Corporation, 1988 IEEE International Solid-State Circuits Conference; (5) "A High Density CMOS 1-T Electrically Erasable NonVolatile (Flash) Memory Technology," S. Tam et al., Intel Corporation; (6) "Reliability Performance Of ETOX Based Flash Memories," Verma et al., Intel Corporation, 1988 IEEE/IRPS; (7) "A Single Transistor EEPROM Cell and Its Implementation in a 512K CMOS EEPROM," Mukherjee, et al., IEEE, IDEM 85, p. 616.

The conventional flash EPROM cell shown in FIG. 1 includes a p-type substrate 20, an n+-type drain 22 provided in the substrate 20, and a double diffused source having a first n−-type source region 24 and a second n+-type source region 26 inset in first source region 24. A tunneling oxide 28 is provided on the surface of the substrate 20; the tunneling oxide 28 has a thickness of approximately 100 Angstroms to enable the tunneling type erase function to be performed. A polysilicon floating gate 30 is provided on the tunneling oxide 28, and an inter-gate dielectric 32 separates floating gate 30 from control gate 34.

The conventional flash EPROM shown in FIG. 2 includes a p-type substrate 40 and n+-type source and drain regions 42, 44 provided in the substrate 40. A tunnel oxide layer 46, having a thickness of approximately 200 Angstroms, is provided on the surface of the substrate 40 under a floating gate 48. Floating gate 48 overlaps a portion of the drain 42 and a portion of the channel. Dielectric 50 separates the floating gate 48 from control gate 52 and a portion of the control gate 52 is formed on gate oxide 46. This cell structure can be considered as two transistors in series; one transistor is the floating gate memory transistor and the other transistor is a series enhancement transistor controlled by the control gate.

In the flash EPROM cells shown in FIGS. 1 and 2 the floating gate is heavily doped, the doping concentration is on the order of $10^{20} cm^{-3}$, and thus a high level of built-in background electrons. The floating gates in those cells also have a thickness of approximately 2000 Angstroms, 1000 Angstroms in the most advanced technology.

Programming a flash EPROM cell is usually accomplished by applying a relatively high voltage (approximately 12 volts) to the control gate and a moderately high voltage (approximately 9 volts) to the drain to generate hot electrons in the channel near the drain. The hot electrons are injected to the floating gate and trapped in the floating gate due to the fact that the floating gate is surrounded by insulators. The change in the threshold voltage, or channel conductance, of the cell created by the trapped hot electrons causes such a cell to be programmed, or charged.

Erasing is accomplished by electron tunneling and/or hot-hole injection. For the structure in FIG. 1, a relatively high voltage (approximately 12 volts) is applied to the source of the cell while the gate is grounded, and the drain is usually floating. The electrons trapped in the floating gate flow toward and cluster at the portion of the floating gate overlying the n+-type source region and tunnel from the floating gate to the source due to the high electric field across the tunnel oxide.

For the structure in FIG. 2, a voltage typically higher than 12 volts is applied to the drain of the cell while the gate is grounded and the source can be left either floating or grounded. Since the drain only includes an n+ region without an n− diffusion, an appreciable number of hot holes are produced at the n+-p surface junction region by the so-called "avalanche effect." Hot holes can be injected from the surface junction to the floating gate and recombine with the trapped electrons, thereby assisting the erasure. If a relatively thick oxide is used as the tunnel oxide, electron tunneling is much less probable and hot-hole injection can actually become the dominant mechanism in erasing. However, it is well known that hot holes are easily captured by oxide traps. The trapped holes can cause serious degradation effect on oxide, namely, oxide charge leakage and early breakdown.

The flash EPROM cells shown in FIGS. 1 and 2 both suffer from the problem that electrical erasing is not self-limiting. Programming a flash EPROM cell involves providing negative charges on the floating gate. Erasing usually leaves the floating gate positively charged due to the tunnelling out of not only the electrons used to program the cell but also some of the built-in background electrons, possibly changing the transistor to a depletion-mode transistor. This is also true in the case of erasing by hot-hole injection.

To prevent over-erasing in the cell structure shown in FIG. 1, an adaptive erase technique must be employed. Adaptive erasing uses complicated circuitry and software to perform a series of erase and verify steps. Each erase step performs only a portion of the erase function and the verify step is used to insure that the cell(s) are not over erased.

Another problem associated with the flash EPROM cell shown in FIG. 1, is that the tunneling oxide thickness must be compromised. The tunneling oxide must be thin enough so that tunneling occurs during erasing, but thick enough so that tunneling is limited during the programming of the cell.

A further problem with the flash EPROM cell structure shown in FIG. 1, is a phenomenon known as bit-line disturb, which causes the tunneling away of the stored charge during the programming of cells on the same bit line. In a memory array of flash EPROM cells, the drains of a group of cells are all connected to a bit line, whereas the control gates of the same group of cells are connected to separate word lines. Programming of individual cells is accomplished by applying the appropriate voltages to the bit line and a selected word line. The application of a voltage to the drain of cells which are not being programmed can cause Fowler-Nordheim tunneling or hot-hole injection, i.e., erasing, at the drain side of the device. The amount of unintentional erasing which occurs is a function of the gate oxide thickness and the length of time that the voltage is applied to the drain. In the structure shown in FIG. 1, where a thin tunneling dielectric 28 underlies the entire floating gate 30, bit line disturb can be a serious problem.

In the structure shown in FIG. 2, erasing is the result of a combination of Fowler-Nordheim tunneling of electrons from the floating gate to the drain region and hot-hole injection from the surface n+-p junction to the floating gate. Adaptive erasing is not used to prevent over-erasing; instead the series enhancement transistor 30 is used to prevent current flow when the memory transistor is placed in the depletion-mode. Particularly, the series enhancement transistor prevents leakage current which occurs in a memory array during programming and/or reading due to an over-erased cell. Although adaptive erasing is not required with the cell structure shown in FIG. 2, the cell structure is approximately 20% larger than the cell shown in FIG. 1 due to the added gate width of the control gate.

The relatively thick gate oxide 46 underlying floating gate 48 makes bit line disturb less of a problem than with the FIG. 1 structure. Nevertheless, in the FIG. 2 structure, a tradeoff is still necessary, in that the gate oxide 46 must be thin enough so that tunneling occurs during erasing. It can be shown that with a gate oxide thickness greater than 125 Angstroms hot hole injection due to surface junction breakdown can dominate over tunnelling. The drawback of the structure in FIG. 2 is that programming and erasing both are done at the drain side. As a result, the oxide thickness and junction structure cannot be optimized for programming or erasing independently.

In conventional flash EPROM cells, when the erase voltage $V_{pp}$ is applied to the source during erasing, the surface of an n+ source is depleted in the n+-gate overlap region. This surface depletion creates a high surface field, which in turn causes band-to-band tunnelling. Band-to-band tunnelling generates holes in an n+ source, and the holes tend to flow to the p-type substrate. The flow of holes to the p-type substrate maintains the surface depletion of the n+ source, thereby increasing the effective thickness of the dielectric. The increase in the effective thickness of dielectric makes tunnelling more difficult.

Another disadvantage of having a band-to-band tunneling current is that it is not feasible to design a charge-pumping circuit to generate the high voltage used for erasing. Typically, the hole current which flows to the substrate is on the order of 0.1 microamps per cell at its peak. For a memory chip of 256K density level, for example, a chip erase can generate as high a substrate current as 25 milli-amps, which cannot be handled by a conventional charge pump. The excessive amount of substrate current produced during erase can prevent the realization of Flash memories successfully implemented in a 5-volt system in the future.

Holes which flow from the n+ surface to the substrate can gain energy from the electric field when crossing the n+-p surface-junction depletion region. Some of the holes become sufficiently hot to be injected into the oxide, as discussed earlier.

A problem with the generation of hot holes is that holes which are trapped in the tunnel oxide during erasing have the effect of reducing the barrier for electron tunnelling, thereby increasing low-level leakages. The low-level oxide leakage can cause erased cells on the same word line to become partially programmed during the programming of other cells on the same word line, a problem termed gate (or word-line) disturb.

SUMMARY OF THE INVENTION

It is, therefore, an object of the present invention to provide an improved floating gate transistor for use in a flash EPROM cell.

A further object of the present invention is to provide a flash EPROM cell having a self-limiting erase characteristics.

Another object of the present invention is to provide a flash EPROM cell which is not subject to bit line disturb or gate disturb.

Another object of the present invention is to provide a flash EPROM cell having a multi-thickness dielectric provided between the substrate and the floating gate, the multi-thickness dielectric having a tunneling dielectric portion overlapping the source, and a gate oxide portion overlapping the drain.

Another object of the present invention is to provide a flash EPROM cell having a semi-insulating floating gate. A semi-insulating gate has a low concentration of built-in background electrons, so that erasing ceases when substantially all of the injected electrons are tunnelled out of the floating gate, returning the cell to its unprogrammed state without removing built-in background electrons. Therefore, the erase operation does not create positive charges on the floating gate, and an enhancement mode device will not be converted to a depletion mode device by the erase operation.

A one transistor flash EPROM cell in accordance with the present invention comprises a substrate, a drain region provided in the substrate, a source region provided in the substrate and spaced from the drain region to define a channel therebetween, a tunneling dielectric overlapping portions of the source region, a gate oxide overlapping the channel and a portion of the drain region, a semi-insulating floating gate provided on the dielectric layer, an inter-gate dielectric provided on the floating gate, and a control gate provided on the inter-gate dielectric. The floating gate has a thickness of less than 1000 Angstroms and a doping level sufficient only to allow injected electrons to redistribute with less than micro-seconds of relaxation time during programming of the EPROM cell. The actual doping level of the floating gate is less than $5 \times 10^{17} cm^{-3}$. Further, the source region may be a double diffused source comprising a first source region and a second source region provided in the first source region, the second source region having a larger doping level than the first source region.

In a first embodiment of a flash EPROM in accordance with the present invention, the tunneling oxide is provided on portions of the substrate corresponding to the position of portions of the first and second source regions, and a portion of the channel region.

In second and third embodiments of a flash EPROM cell in accordance with the present invention, the tunneling dielectric is provided on portions of the substrate corresponding to a first portion of the first source region and a portion of the second source region, and the gate oxide is provided on portions of the substrate corresponding to the entire channel region and a second portion of the first source region.

BRIEF DESCRIPTION OF THE DRAWINGS

FIG. 1 is a partial, cross-sectional view of a conventional one transistor flash EPROM cell;

FIG. 2 is a part cross-sectional view of another conventional one transistor flash EPROM cell;

FIGS. 9A and B are graphs showing that flash EPROM cells in accordance with the present invention are resistant to the gate disturb problem.

DESCRIPTION OF THE PREFERRED EMBODIMENTS

Flash EPROM cells 90, 92 and 94 corresponding to first, second, and third embodiments of improved floating gate transistors in accordance with the present invention will be described with reference to FIGS. 3, 4 and 5, respectively. The improved floating gate transistors of the present inventions are described in the context of flash EPROM cells. Such flash EPROM cells may be formed by a single transistor. It is to be understood that the improved floating gate transistors of the present invention are useful in other applications. For example, the floating gate transistors of the present inventions may be used with a select transistor to construct an EEPROM cell. Other applications include E²PALs and other programmable logic devices.

Figure 3:
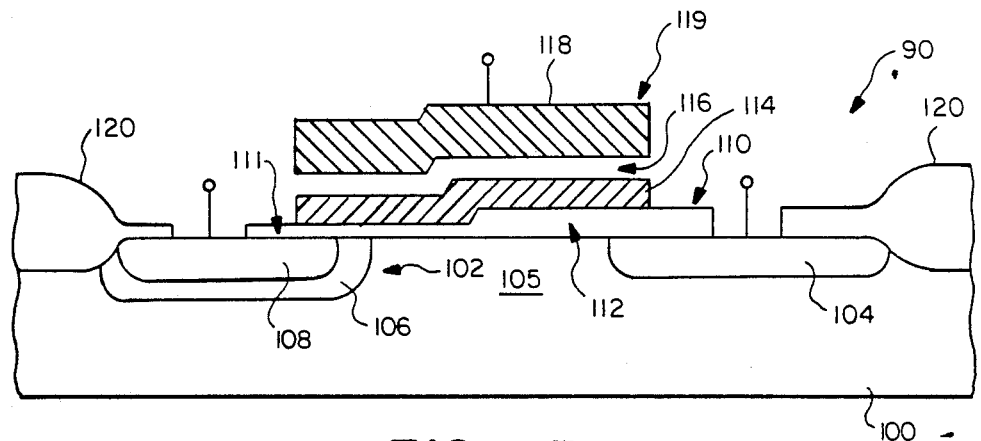
FIG. 3 is a partial, cross-sectional view of a first embodiment of a one transistor flash EPROM cell in accordance with the present invention.

As shown in FIG. 3, a one transistor flash EPROM cell 90 in accordance with the present invention comprises a substrate 100 having source 102 and drain 104 regions provided therein. Source 102 and drain 104 are spaced apart to define a channel 105 therebetween. The substrate 100 is usually a p-type semiconductor with source 102 and drain 104 being n-type regions; however, it is possible to build a one transistor flash EPROM cell having opposite conductivity types from those described herein, or to build the devices described herein in a p-well provided in an n-type substrate. Accordingly, the description of the preferred embodiments of the present invention are not intended to limit the invention to particularly conductivity types.

Source 102 has a double diffused structure, including a first n⁻-type source region 106 and a second n⁺-type source region 108 provided in first source region 106. Drain region 104 has n⁺-type conductivity. The doping level for n⁻ source 106 is approximately $1 \times 10^{19} \text{cm}^{-3}$, and the doping level for n⁺ source 108 and n⁺ drain 104 is approximately $3 \times 10^{20} \text{cm}^{-3}$.

A multi-thickness dielectric layer 110, provided on the surface of substrate 100, includes a tunnelling dielectric region 111 and a gate oxide region 112. As used herein, "multi-thickness" refers to the characteristic that at least two portions of the dielectric have different physical or effective thicknesses. Effective thickness refers to changes in the tunneling characteristics of a dielectric due to factors other than physical thickness, for example, the type of dielectric material, the electric field applied across the dielectric, and/or any effects such as an intentional depletion of the source or drain which changes the tunnelling characteristics of the dielectric. Thus, the tunnelling dielectric 111 and the gate oxide 112 may have different thicknesses, or may be formed of different materials having the same thickness. Alternatively, the multi-thickness dielectric 110 may be formed of two portions of the same material having the same thickness but different effective thicknesses.

Multi-thickness dielectric 110 serves several purposes, including the elimination of the need to compromise on the thickness of the oxide layer to provide a balance between the functions of a tunnelling dielectric and a gate oxide. Tunnelling dielectric 111, provided on the source side of the device, allows tunnelling to occur during the erase operation; gate oxide 112, provided at the drain side of the device, prevents tunnelling during programming and eliminates or reduces the bit line disturb problem associated with conventional flash EPROMs. Tunnelling dielectric 111 is less than 150 Angstroms thick, with the preferred thickness ranging from 80 to 110 Angstroms. Gate oxide 112 has a thickness which is greater than approximately 200 Angstroms.

An additional benefit of the thick gate oxide 112 is that the drain junction breakdown voltage is increased so that very few hot holes are generated. Preventing the generation of hot holes is useful in eliminating the loss of charge in unselected cells on the same bit line as a cell being programmed. Since source 102 is at ground potential during programming, tunnelling does not occur from the floating gate 114 to the source 102 during programming. On the other hand, the thin tunnelling dielectric 111 is desirable to facilitate tunnelling at the source side of the cell during erasing.

Floating gate 114 is provided on multi-thickness dielectric 110. The floating gate 114 is formed of a semi-insulating material, for example, lightly doped polysilicon, which has very few built-in background free electrons. In particular, the background electron concentration in the unprogrammed state is far less than the injected electron concentration of the programmed state. Since floating gate 114 is a semiinsulating material, the so-called capacitive coupling effect either does not exist or is quite small. Therefore, the floating gate 114 can be considered as portion of the dielectric 110; however, floating gate 114 is sufficiently conductive so that injected electrons can re-distribute themselves with a relaxation time of less than 1 μs. The semi-insulating characteristic of floating gate 114 is provided by, for example, forming the floating gate 114 with polysilicon having an actual doping level of approximately $5 \times 10^{17} cm^{-3}$. The term "actual doping level" refers to the density of donor dopants introduced, e.g., implanted, into the material of floating gate 114. The polycrystalline characteristics of polysilicon prevent the activation of many dopants which are introduced, and, in general, only one percent (1%) of implanted dopants are activated—activation of implanted dopants is usually accomplished by annealing. The desired activated carrier concentration for a polysilicon floating gate 114 is approximately $1 \times 10^{16} cm^{-3}$.

It is well known that the resistivity of a polysilicon film (or layer) is a function of the film deposition technology and the thermal cycles to which the polysilicon film is subjected. The film resistivity is determined by the number of built-in electrons and their mobilities in the polysilicon film. Thus, the actual doping levels set forth herein are related to the stated fabrication techniques and equivalents thereof. If alternate deposition technologies are employed the actual doping level should be varied to provide an activated carrier concentration of less than $1 \times 10^{16} cm^{-3}$.

An inter-gate dielectric 116 separates floating gate 114 and control gate 118, with the floating gate 114, inter-gate dielectric 116 and control gate 118 forming gate structure 119.

The coupling effect of semi-insulating floating gate 114 is very weak and floating gate 114 essentially behaves as an insulator before the cell 90 is programmed. Therefore, floating gate 114 must be relatively thin so that the channel conductance is controlled by the voltage applied to control gate 118. In the present invention, the floating gate 114 is less than approximately 1000 Angstroms in thickness.

A further benefit of the semi-insulating floating gate 114 is that the electric field of unselected (or erased) cells on the same word line as a cell being programmed is decreased during programming of other cells on the same word line due to the increase in the effective thickness of gate oxide 112. On the other hand, a small penalty is associated with the use of a semi-insulating floating gate 114, in that the core gain is reduced; specifically, there is a reduction in the channel current during reading of the cell 90. This reduction in the channel current can be overcome by increasing the width of the transistor. Thus, the area of a flash EPROM cell in accordance with the present invention is approximately 25% larger than the area of the conventional flash EPROM cell shown in FIG. 1 and approximately equal to the area of the conventional flash EPROM cell shown in FIG. 2.

The flash EPROM cell 90 of the first embodiment of the present invention is fabricated in the following manner. First, field oxide regions 120 are formed on substrate 100 to separate the areas where multiple flash EPROM cells will be formed on a single substrate. An oxide layer is grown on the surface of the substrate 100 and the portion of the oxide layer which is to become gate oxide 110 is masked. The remaining portion of the oxide layer is removed, and tunnelling dielectric 111 is then grown. The gate structure 119, including floating gate 114, inter-gate dielectric 116 (usually silicon oxide, or a combination of silicon oxide and nitride) and control gate 118, is formed on dielectric layer 110. In accordance with conventional manufacturing techniques the various elements of the gate structure 119 are formed as continuous layers and then etched to achieve the final structure.

After the gate structure 119 is formed, n⁻ source 106 is formed by implanting a light dose of an n-type dopant, e.g., phosphorus ions, with an energy ranging from 50–75KeV, and driving the implanted ions with a thermal cycle. N+ drain 104 and n+ source 108 are then implanted with an energy ranging from 50–70KeV and thermally driven. Since the gate structure 119 is formed prior to implanting source 102 and drain 104, source 102 and drain 104 are self-aligned with the gate structure 119.

Figure 4:
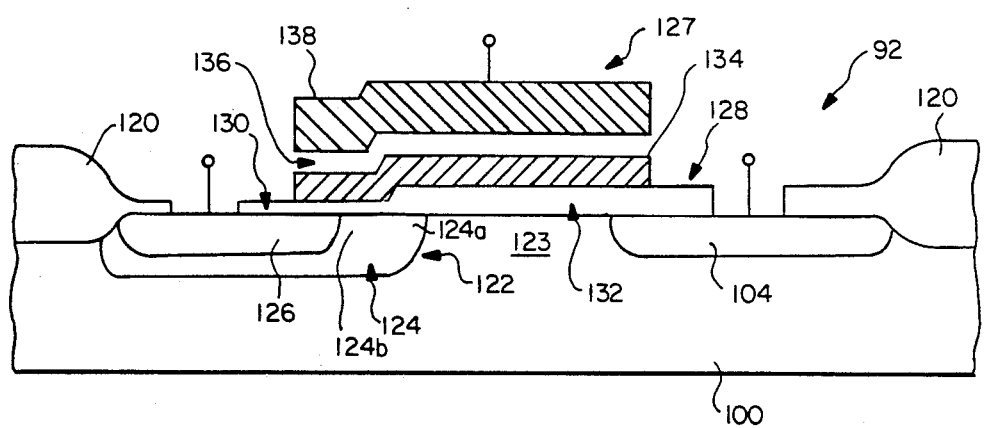
FIG. 4 is a partial, cross-sectional view of a second embodiment of a one transistor flash EPROM cell in accordance the present invention.

With reference to FIG. 4, a flash EPROM cell in accordance with the second embodiment of the present invention is also formed in a portion of a substrate 100 isolated by field oxide regions 120. N+ drain region 104 and double diffused source 122 are provided in the substrate, with source 122 and drain 104 defining a channel 123 therebetween. Source 122 includes a first, n⁻ source region 124 and a second, n+ source region 126. The doping level for n⁻ source 124 is approximately $1 \times 10^{19} cm^{-3}$, and the doping level for n+ source 126 and n+ drain 104 is approximately $3 \times 10^{20} cm^{-3}$.

Source 122 of the second embodiment differs from source 102 of the first embodiment, in that n⁻ source 124 is not self-aligned with the gate structure 127 and extends further under the gate structure 127. The second source region 126, however, is self-aligned with the gate structure 127.

A multi-thickness dielectric 128, including a tunnelling dielectric 130 and a gate oxide 132, is provided on the surface of substrate 100. In this second embodiment of the invention, gate oxide 132 is formed on portions of substrate 100 which overlap drain 104, channel 123, and a first portion 124a of n⁻ source 124. Tunnelling dielectric 130 is formed on a portions of the surface of substrate 100 corresponding to the position of a second portion 124b of n⁻ source 124 and a portion of n+ source 126. The gate structure 127 of the second embodiment, which is similar to the gate structure 119 in the first embodiment, includes semiinsulating floating gate 134, inter-gate dielectric 136, and control gate 138. Semi-insulating gate 134 has an activated carrier concentration of less than approximately $1 \times 10^{16} cm^{-3}$ and a thickness of less than 1000 Angstroms.

The overlap of gate oxide 132 and a portion of n⁻ source 124 suppresses hot hole generation during erasing and creates an energy barrier to the flow of holes into the substrate 100. Thus, the gate disturb problem is prevented and erase tunnelling is facilitated by the prevention of continuous hole generation and the collapse of the surface depletion layer. Further, since the generation of holes is prevented, only a negligible hole current will flow to the substrate.

The fabrication of a flash EPROM cell in accordance with the second embodiment of the present invention includes the following steps. First, an oxide is grown on the surface of substrate 100. The portion of the oxide outside of the tunnelling region, comprising gate oxide 132, is masked for the implantation of phosphorus or arsenic ions to form n⁻ source 124. The portion of the oxide exposed to the implantation is removed by etching. Tunnel dielectric 130 is then grown on the surface of substrate 100, completing the formation of multi-thickness dielectric 128. The gate structure 127 is formed on multi-thickness dielectric 128, and then used as a mask to implant self-aligned n+ drain 104 and n+ source 126. The doping levels and implant energies are approximately the same as those utilized in the fabrication of a flash EPROM cell in accordance with the first embodiment.

Figure 5:
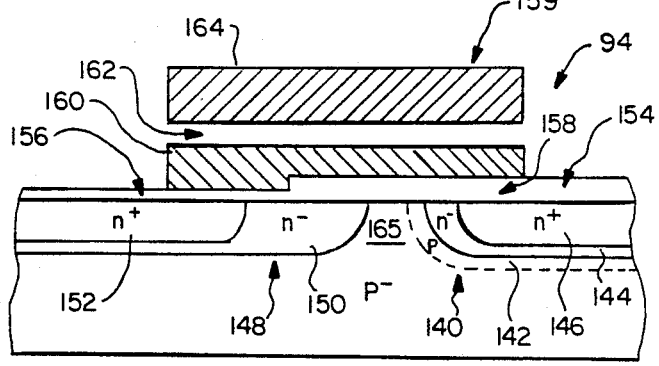
FIG. 5 is a partial, cross-sectional view of a third embodiment of a one transistor flash EPROM cell in accordance with the present invention.

In the third embodiment of a flash EPROM cell in accordance with the present invention, shown in FIG. 5, a p−-type substrate 139 is used and the drain region 140 includes a p-type region implanted into substrate 139. In addition, the drain 140 has a double diffused structure including a first, n−-type drain region 144 and a second, n+-type drain region 146 provided in n− drain 144. Source region 148 includes a first, n−-type region 150 and a second, n+-type 152 provided in n−-type region 150. The doping level for n− source 150 is approximately $2 \times 10^{19} cm^{-3}$, and the doping level for n+ source 152 is approximately $3 \times 10^{20} cm^{-3}$. The doping level for n− drain 144 is approximately $2 \times 10^{19} cm^{-3}$, and the doping level for n+ drain 146 is approximately $3 \times 10^{20} cm^{-3}$. The implant energies are as follows: n− drain 144, 60KeV; n+ drain 146, 50KeV; n− source 150, 60KeV; and n+ source 152, 50KeV.

A multi-thickness dielectric 154, including gate oxide 158 and tunnelling dielectric 156, is provided on the surface of substrate 139. Gate structure 159, provided on dielectric 154, is similar to that of the first and second embodiments, including semiinsulating floating gate 160, inter-gate dielectric 162, and control gate 164. The attributes of multi-thickness dielectric 154 and the elements of gate structure 159, including floating gate 160, are similar to those of corresponding elements in the first and second embodiments.

In the second embodiment, the channel region 123 formed between drain 104 and first source region 124 is not self-aligned because n− source 124 is implanted before the gate structure 127 is formed. To provide self-aligned elements, the method of fabricating a flash EPROM cell in accordance with the third embodiment of the present invention is as follows. First, the substrate is masked and p-type region 142 is implanted. The substrate is then re-masked and n−-type regions 144 and 150 are implanted. An oxide layer is then grown on substrate 139, and the oxide layer is masked and etched so that gate oxide 158 remains. Tunnelling dielectric 156 is then grown on the surface of substrate 139, completing the formation of multi-thickness dielectric 154. Gate structure 159 is formed on multi-thickness dielectric 154, and, subsequently, n+ drain region 146 and n+ source region 152 are implanted.

Figure 6:
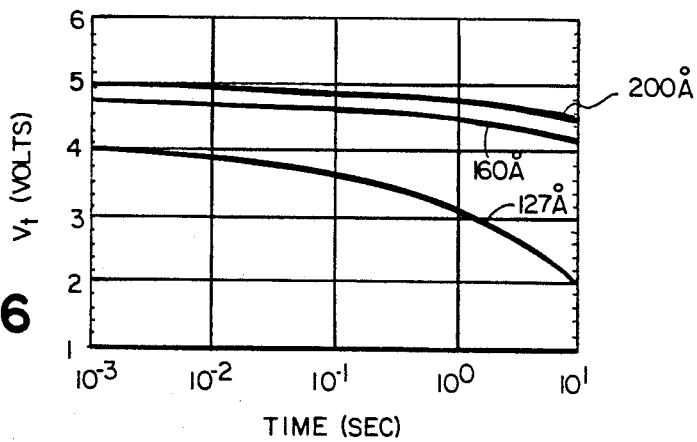
FIG. 6 is a graph for explaining the relationship between gate oxide thickness and the bit line disturb problem.

FIG. 6 is a graph which shows the relationship between the thickness of a gate oxide and the bit line disturb problem. In particular, FIG. 6 shows the reduction in the charge ($V_t$), in volts, stored on the floating gate versus time for gate oxide thicknesses of 127 Angstroms, 160 Angstroms, and 200 Angstroms. From FIG. 6 it is clear that the bit line disturb problem depends on gate oxide thickness, and that a gate oxide thickness of 200 Angstroms or greater is required to prevent the bit line disturb problem.

Figure 7:
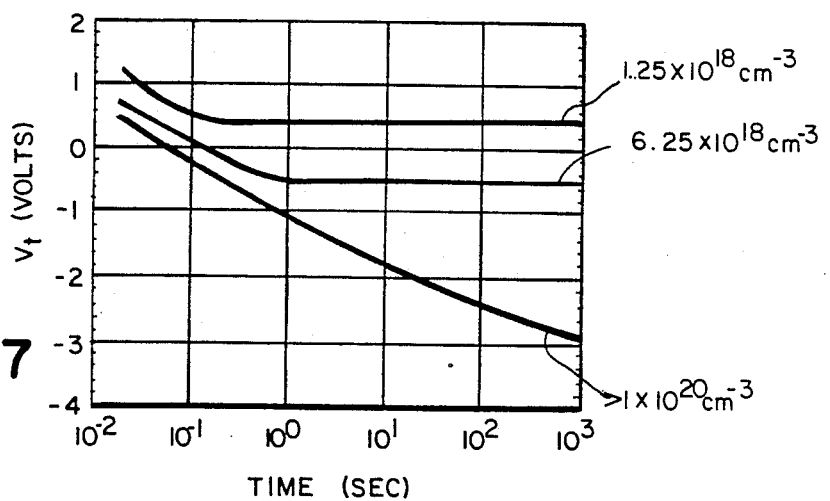
FIG. 7 is a graph for explaining the selflimiting erase characteristics of one transistor flash EPROM cells in accordance with the present invention.

FIG. 7 shows the self-limiting erase characteristics of a flash EPROM cell in accordance with the present invention, as compared with conventional devices. In FIG. 7 $V_t$ is plotted against time. Devices having floating gate actual doping levels of greater than $1 \times 10^{20} cm^{-3}$ exhibit a continued removal of negative charges from the floating gate. A floating gate actual doping level of approximately $6.25 \times 10^{18} cm^{-3}$ limits the removal of negative charges from the floating gate at a voltage of −0.5 volts. A floating gate actual doping level of approximately $1.25 \times 10^{18} cm^{-3}$, which is greater than the estimated optimum actual doping level of $5 \times 10^{17} cm^{-3}$, provides the desired effect of limiting the removal of electron charges from the floating gate upon erasing. The graph clearly illustrates that the floating gate voltage $V_t$ continues to decrease well below 0 volts for the conventional device, whereas the floating gate voltage $V_t$ for a flash EPROM cell having an actual doping level of less than approximately $2 \times 10^{18} cm^{-3}$, in accordance with the present invention, provides a self-limiting erase characteristic.

Figure 8A:
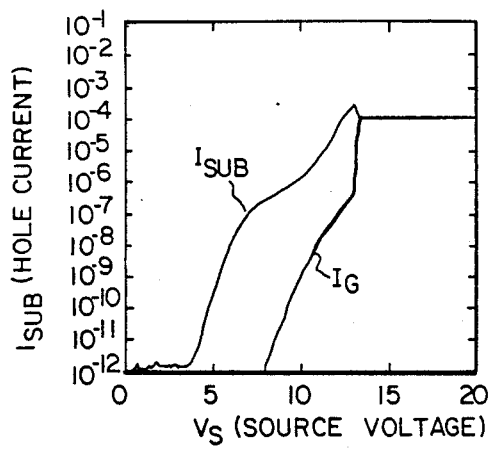
FIGS. 8A–C are graphs illustrating the prevention of hole current generation in the flash EPROM cells of the present invention.
Figure 8B:
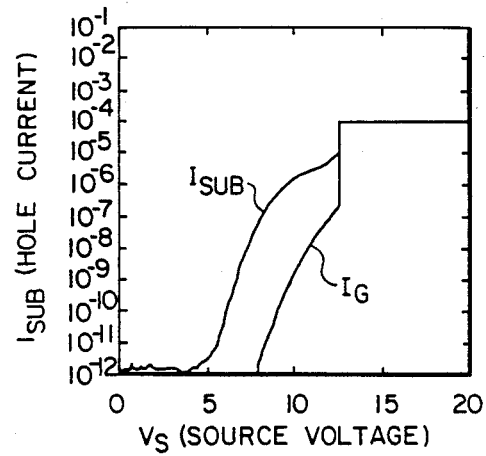
Figure 8C:
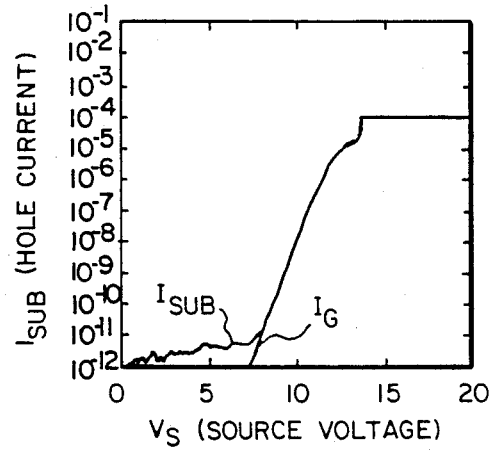

FIGS. 8A–C compare the hole current ($I_{sub}$) and gate or Fowler-Nordheim current ($I_G$) versus source voltage ($V_s$) for several structures. FIG. 8A relates to a conventional structure without a double diffused source; FIG. 8B relates to the structure of the first embodiment disclosed herein (FIG. 3); and FIG. 8C relates to the structures of the second and third embodiments of the present invention (FIGS. 4 and 5). FIG. 8A shows that a hole current is present for values of $V_s$ above approximately 3 volts in the conventional structure. The first embodiment of the present invention does not exhibit a hole current until $V_s$ reaches approximately 5.5 volts, and the second and third embodiments of the present invention do not exhibit a hole current. In particular, in structures in accordance with the second and third embodiments of the present invention $I_{sub}$ is equal to $I_G$.

FIGS. 9A and B show the resistance of the flash EPROM cells of the present invention to the gate disturb problem, by plotting the threshold voltage $V_t$ versus time. It is noted that although the graphs plot $V_t$, if it is assumed that $V_t$ is zero volts at $t = 10^{-3}$ seconds the voltage shown is the change in voltage. FIG. 9A shows $V_t$ as 0.5 volts at $t = 10^{-3}$s, and thus the change in voltage can be calculated by subtracting 0.5 volts from all values of $V_t$. The gate disturb characteristics of EPROM cells in accordance with the first embodiment are shown in FIG. 9A for erase voltage values of 10 volts (shown by the characters +) and 11 volts (shown by the characters x). The gate disturb characteristics of EPROM cells in accordance with the second and third embodiments are shown in FIG. 9B for erase voltage values of 10 volts (shown by the characters +) and 11 volts (shown by the characters x). The typical disturb time in high-density flash EPROM (1Mb) is less than one second. At one second, FIG. 9A shows an approximate 1 volt change in $V_t$ whereas FIG. 9B only shows less than 0.1 volt change in $V_t$.

The many features and advantages of the floating gate transistors and flash EPROM cells fabricated with such transistors will be apparent to those of ordinary skill in the relevant art. Accordingly, the scope of the subject inventions, as recited in the following claims, shall include all equivalents of the elements and features of the subject inventions.

What is claimed is:

1. An electrically programmable and erasable semiconductor device, provided on a substrate, comprising:
   a drain region provided in the substrate;
   a source region provided in the substrate, said source region comprising a first lightly doped source region and a second heavily doped source region provided in said first source region and being spaced from said drain region to define a channel region therebetween;

dielectric means for limiting tunnelling during programming and allowing tunnelling during erasing, said dielectric means comprising a tunnelling dielectric having a first thickness provided on a portion of the substrate corresponding to the position of a portion of said source region and a gate oxide having a second thickness greater than said first thickness provided on a portion of the substrate corresponding to the position of a portion of said channel and a portion of said drain region;

a floating gate provided on said dielectric means;

an inter-gate dielectric provided on said floating gate; and a control gate provided on said inter-gate dielectric.

2. A semiconductor device according to claim 1, wherein said floating gate has a thickness of less than 1000Å and an actual doping level of less than $5 \times 10^{18} cm^{-3}$.

3. A semiconductor device according to claim 1, wherein said floating gate has a thickness of less than 1000Å and an activated carrier concentration of less than $1 \times 10^{17} cm^{-3}$.

4. A semiconductor device according to claim 2, wherein:

said tunneling dielectric has a thickness of less than approximately 150Å; and said gate oxide has a thickness of greater than approximately 200Å.

5. A flash EPROM cell having self-limiting erase characteristics, provided on a substrate, comprising:

a drain region provided in the substrate;

a source region provided in the substrate and spaced from said drain region to define a channel region between said source and drain regions, said source region comprising a first lightly doped region and a second more heavily doped region provided in said first region;

multi-thickness dielectric means, provided on the substrate, said multi-thickness dielectric means comprising a gate oxide for limiting tunneling during programming of the cell and providing an energy barrier to the flow of notes into the substrate, and a tunnelling dielectric for allowing tunneling during erasing of the cell;

a floating gate provided on said multi-thickness dielectric means, said floating gate having a doping level sufficient only to allow injected electrons to redistribute during the programming of the EPROM cell;

inter-gate dielectric means provided on said floating gate; and a control gate provided on said inter-gate dielectric means.

6. A flash EPROM cell according to claim 5, wherein said multi-thickness dielectric includes a tunneling dielectric overlapping a portion of said source region, and a gate oxide overlapping a portion of said drain region and a portion of the channel.

7. A flash EPROM cell according to claim 6, wherein:

said tunneling dielectric overlaps a portion of said first lightly doped source region and a portion of said second more heavily doped region.

8. A flash EPROM cell according to claim 7, wherein:

said floating gate has a thickness of less than 1000Å and an activated carrier concentration of less than $1 \times 10^{17} cm^{-3}$.

9. A flash EPROM cell according to claim 8, wherein:

said tunneling dielectric has a thickness of less than approximately 150Å; and said gate oxide has a thickness of greater than 200Å.

10. A flash EPROM cell according to claim 6, wherein said floating gate comprises semi-insulating polysilicon.

11. A one transistor flash EPROM cell provided on a substrate, comprising:

a drain region provided in the substrate;

a first source region provided in the substrate, said first source region being spaced from said drain region to define a channel region therebetween;

a second source region provided in said first source region, said second source region having a greater doping level than said first source region;

a tunneling dielectric provided on a portion of the substrate corresponding to a first portion of said first source region and a portion of said second source region, said tunneling dielectric having a first thickness;

a gate oxide provided on a portion of the substrate corresponding to a second portion of said first source region and a portion of said drain region, said gate oxide having a second thickness greater than said first thickness;

a floating gate provided on portions of said tunneling dielectric and said gate oxide, said floating gate having a doping level sufficient only to allow injected electrons to redistribute during the programming of the EPROM cell;

an inter-gate oxide layer provided on said floating gate; and a control gate provided on said inter-gate oxide.

12. A flash EPROM cell according to claim 11, wherein said gate oxide is provided on a portion of the substrate corresponding to substantially the entire channel region.

13. A semiconductor device according to claim 11, wherein said floating gate has a thickness of less than 1000Å and an activated carrier concentration of less than approximately $1 \times 10^{17} cm^{-3}$.

14. A semiconductor device according to claim 13, wherein:

said tunneling dielectric has a thickness of less than approximately 150Å; and said gate oxide has a thickness of greater than approximately 200Å.

15. A one transistor flash EPROM cell provided on a substrate, comprising:

a first drain region provided in the substrate;

a second drain region provided in said first drain region, said second drain region having a greater doping level than said first drain region;

a first source region provided in the substrate, said first source region being spaced from said first drain region to define a channel region therebetween;

a second source region provided in said first region, said second source region having a greater doping level than said first source region;

a tunneling dielectric provided on the substrate, said tunneling dielectric overlapping a first portion of said first source region and a portion of said second source region;

a gate oxide provided on the substrate, said gate oxide overlapping a second portion of said first source region and portions of said first and second drain regions;

a semi-insulating floating gate provided on said tunneling dielectric and said gate oxide;

an inter-gate oxide layer provided on said floating gate; and a control gate provided on said inter-gate oxide.

16. A flash EPROM cell according to claim 15, wherein said gate oxide is provided on a portion of the substrate corresponding to substantially the entire channel region.

17. A semiconductor device according to claim 15, wherein said floating gate has a thickness of less than 1000Å and an actual doping level of less than $5 \times 10^{18} cm^{-3}$.

18. A semiconductor device according to claim 15, wherein said floating gate has a thickness of less than 1000Å and an activated carrier concentration of less than approximately $1 \times 10^{17} cm^{-3}$.

19. A semiconductor device according to claim 17, wherein:
said tunneling dielectric has a thickness of less than approximately 150Å; and
said gate oxide has a thickness of greater than approximately 200Å.

20. A one transistor flash EPROM cell provided on a p-type substrate, comprising:
an $n^-$-type drain region provided in the substrate;
an $n^+$-type drain region provided in said $n^-$-type drain region;
an $n^-$-type source region provided in the substrate, said $n^-$-type source region being spaced from said $n^-$-type drain region to define a channel region therebetween;
an $n^+$-type source region provided in said $n^-$-type source region; a tunneling oxide provided on the substrate, corresponding to a first portion of said $n^-$-type source region and a portion of said $n^+$-type source region, said tunneling oxide having a thickness of less than approximately 150Å;
a gate oxide provided on a portion of the substrate, corresponding to a second portion of said $n^-$-type source region and portions of said $n^-$-type and $n^+$-type drain regions, the overlap of said gate oxide and said $n^-$-type source providing an energy barrier to the flow of holes into the substrate, said gate oxide having a thickness of greater than approximately 200Å;
a semi-insulating polysilicon floating gate provided on said tunneling oxide and said gate oxide, said floating gate having a thickness of less than 1000Å and an activated carrier concentration of less than approximately $1 \times 10^{17} cm^{-3}$;
an inter-gate oxide layer provided on said floating gate; and
a control gate provided on said inter-gate oxide.

21. An improved transistor, including a substrate, a drain region provided in the substrate, a first source region provided in the substrate, the first source region being spaced from the drain region to define a channel region therebetween, a second source region provided in the first region, the second source region having a greater doping level than the first source region, an dielectric layer provided on the substrate, a floating gate provided on the dielectric layer, an inter-gate oxide layer provided on the floating gate, and a control gate provided on the inter-gate oxide, characterized in that:
the dielectric layer comprises:
a tunneling oxide overlapping a portion of the first source region and a portion of the second source region, and
a gate oxide overlapping a portion of the drain region; and
the floating gate has a thickness of less than 1000Å and an activated carrier concentration of less than $1 \times 10^{17} cm^{-3}$.

22. An improved transistor according to claim 21, further characterized in that the tunneling oxide overlaps a first portion of the first source region and the gate oxide overlaps a second portion of the first source region.

23. An electrically programmable and erasable semiconductor device, provided on a substrate, comprising:
a drain region provided in the substrate;
a source region provided in the substrate, said source region being spaced from said drain region to define a channel region therebetween;
a dielectric overlying said channel and portions of said source region and said drain regions;
a floating gate provided on said dielectric means, said floating gate having a thickness of less than 1000Å and an actual doping level of less than $5 \times 10^{18} cm^{-3}$;
an inter-gate dielectric provided on said floating gate; and
a control gate provided on said inter-gate dielectric.

24. An electrically programmable and erasable semiconductor device according to claim 23, wherein said dielectric comprises a tunnelling dielectric having a thickness less than approximately 150Å overlying a portion of said source region and a portion of said channel, and a gate oxide having a thickness greater than approximately 200Å overlying a portion of said channel and a portion of said drain region.

25. An electrically programmable and erasable semiconductor device according to claim 24, wherein said source region comprises a first lightly doped source region and a second heavily doped source region provided in said first source region.

26. An electrically programmable and erasable semiconductor device according to claim 23, wherein said floating gate has an activated carrier concentration of less than $1 \times 10^{17} cm^{-3}$.

27. An electrically programmable and erasable semiconductor device according to claim 25, wherein said tunnelling dielectric overlies a portion of said first source region and a portion of said second source region, and said gate oxide overlies a portion of said first source region, said channel and a portion of said drain region.

* * * * *